Sept. 28, 1965 J. M. STEINER 3,209,065

HERMETICALLY ENCLOSED ELECTRONIC DEVICE

Filed Aug. 2, 1962

WITNESSES

Leon J. Taza

Raymond H. Majerko

INVENTOR

Joseph M. Steiner

BY

Frederick Shapoe

ATTORNEY 3,209,065
HERMETICALLY ENCLOSED ELECTRONIC DEVICE

Joseph M. Steiner, Franklin Township, Westmoreland County, Pa., assignor to Westinghouse Electric Corporation, East Pittsburgh, Pa., a corporation of Pennsylvania Filed Aug. 2, 1962, Ser. No. 214,356
8 Claims. (Cl. 174—52)

The present invention relates to a hermetically enclosed functional molecular electronic device.

Heretofore, problems have arisen in encapsulating or packaging functional molecular electronic elements. In order to effectively utilize such devices it is highly desirable that the element and the accompanying package occupy as little volume as possible.

A functional molecular electronic element, as used hereinafter, is normally comprised of a body of semiconductor material, for example, germanium, silicon and stoichiometric combinations of III–V and II–IV compounds. The body may be comprised of one or more active regions, such as, a diode, transistor, four region two or three terminal devices or combinations thereof and the like. One or more regions may function as a capacitance or a capacitance area disposed upon at least one surface of the body and one or more regions may function as a resistance, either fixed or variable. The body may also contain an inductance in addition to or in place of the resistance. The various regions and areas are connected in circuit relationship through the bulk of the body without external electrical connections. The only external electrical connections affixed to the body are the input, output and in some instances biasing or control leads.

Examples of such functional molecular electronic elements can be found in patent applications Serial Nos. 178,476 filed March 8, 1962, 89,498 filed February 15, 1961 now Patent No. 3,173,069 and 176,723 filed March 1, 1962.

Applications, such as, space vehicular travel and missiles dictate that such multiregion devices be miniaturized as much as possible.

The object of the present invention is to provide a substantially miniaturized hermetically sealed functional electronic device wherein a relatively flat functional electronic element is joined to a flat surfaced, relatively thin, good thermally conductive support member having expansion characteristics closely similar to that of the element, electrical leads are joined to the electronic element and a relatively thin layer of electrically insulating material is applied to the exposed surface of the element and extends beyond all of the edges of the element and is joined to the support to hermetically enclose the same.

Other objects of the invention will, in part, be obvious and will, in part, appear hereinafter.

In order to more fully understand the nature and objects of the invention, reference should be had to the following detailed description and drawing, in which.

In accordance with the present invention, and in attainment of the foregoing objects there is provided a hermetically sealed functional electronic device comprising a substantially flat surfaced, relatively thin, good thermally conductive support member. The support member may comprise one or more of the metals tungsten, tantalum and molybdenum or base alloys thereof or an iron base alloy selling under the trade name Kovar or may comprise a ceramic material, such as, alumina, beryllia or porcelain. The support member is provided with means for connecting it to a heat sink, such as, slots or studs. A functional molecular electronic element having relatively flat surfaces is joined at one flat surface to support member with a non-conducting adhesive, such as an epoxy resin, or a thin sheet of insulating material is first joined to the support and the element is joined to the insulating material when the support member is a metal. The leads of the electronic element should also, of course, be insulated from the support member if the latter is of metal. In instances in which the support member is of a ceramic material, use of additional insulating material may be avoided. It is preferred that the thermal expansion characteristics of the support member closely match that of the molecular electronic element. Two or more electrical leads are joined to the element. The electrical leads may comprise any good electrically conductive material such as copper, silver and aluminum or base alloys thereof and the leads may be suitably coated with a material such as gold to facilitate joining the leads to the elements. A portion of each lead extends beyond the outer periphery of the support so that they may be connected in an electrical circuit. Where the support member comprises a metal, a relatively thin layer of electrically insulating material such as inorganic fibrous material having a resinous composition, or a fluorinated organic resin is applied to the other flat surface of the element and extends beyond all of the edges of the element joined to the support to hermetically enclose the element. Where the support member comprises a ceramic material, a cover plate comprising a metal, such as, tungsten, molybdenum or tantalum may be applied to the other flat surface of the element and joined to the support to provide a hermetic seal for the element.

Figure 1:
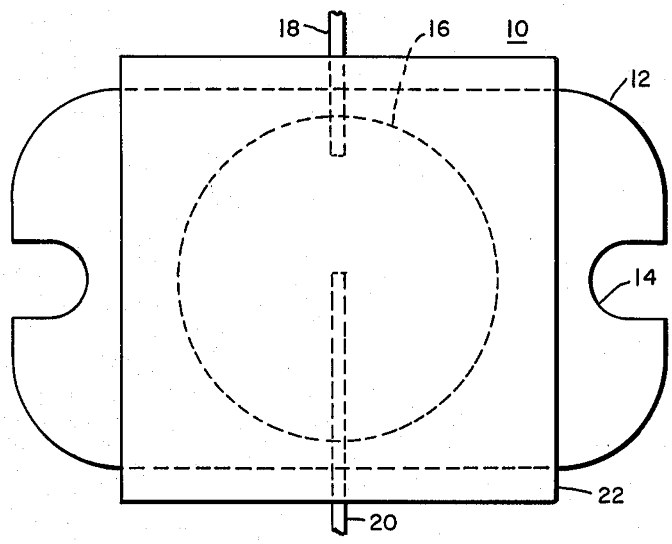
FIGURE 1 is a plan view of the functional electronic device of the invention.
Figures 2, 3, 4:
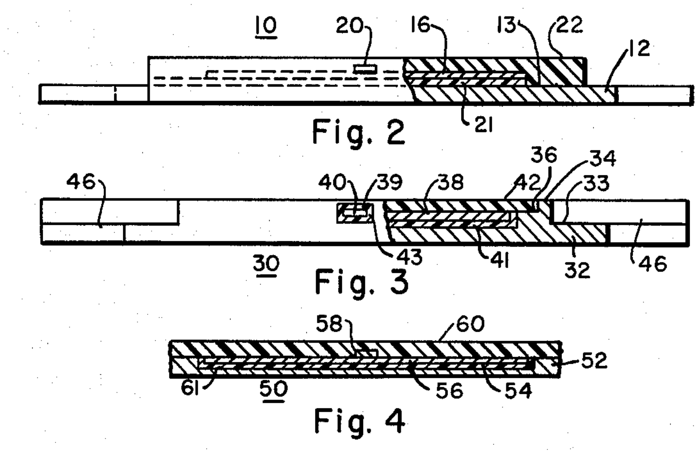
FIG. 2 is an elevation view partially in cross section of the device of the invention.
FIG. 3 is an elevation view partially in cross section of a modification of the device of the invention.
FIG. 4 is an elevation view in cross section of a further modification of the device of the invention.

Referring to FIGS. 1 and 2, there is shown the functional electronic device 10 of the invention. The device 10 comprises a good thermally conductive support member 12 having a substantially flat surface 13. A functional molecular electronic element 16 is disposed on and joined to the flat surface 13 of the support 12 and electrical leads 18 and 20 are attached to predetermined regions of the element 16. A layer 21 of electrically insulating material is disposed between support 12 and element 16. A thin layer 22 of electrically insulating material is then applied to the upper surface of the element and to a greater part of the upper surface 13 of the support 12 to hermetically enclose the element 16. The layer 22 may be joined thereto as a thin sheet of material or may be applied as a viscous resin with a suitable swab and subsequently cured. The support 12 is provided with a slot 14 at each end thereof so that the device 10 may be attached to a heat sink.

Referring to FIG. 3, there is shown a modification 30 of the device of the invention. The modification 30 comprises a good relatively thin thermally conductive support member 32. The member has a thin walled, continuous ridge 34 extending from the upper surface 33 of the support 32. The ridge comprises at least two apertures 39 and contains a stepped segment 36, the area delineated by the ridge being a cavity. A relatively flat functional molecular electronic element 38 is joined at one surface to the upper surface 33 of the support member 32 within the cavity defined by the stepped segment 36. A layer 41 of electrically insulating material is disposed within the cavity to insulate element 38 from support member 32. Electrical leads 40 are joined to the element 38 and pass through the apertures 39 in the ridge. The leads are insulated from the ridge 34 in well known manner by insulating material 43. A relatively thin layer 42 of electrically insulating material is joined to the stepped portion or segment 36 of the ridge 34 and provides a hermetic enclosure for the element 38. The support 32 is provided with a tapered slot 46 at each end thereof so that the device 30 may be attached to a heat sink.

Referring to FIG. 4, there is shown a further modification 50 of the device of the invention. The device shown has a support member 52 having a cavity 54 in the upper surface thereof. A functional molecular electronic element 56 is disposed in the cavity 54 and is joined at one surface to the support 52. A layer 61 of electrically insulating material is disposed within the cavity 54 to insulate element 56 from support 52. Electrical leads 58 are attached to the element 56 in the same manner as provided in FIGS. 1 and 2. A relatively thin sheet of insulating material 60 is attached to the other surface of the element 56 and to a portion of the support 52 to hermetically enclose the element 56 and effectively seal the lead 58. The remainder of the device is similar to that shown in FIGS. 1 and 2. A typical device measures 0.6" x 0.5" x 0.07", however, larger and smaller devices have been produced.

It is intended that the foregoing description and drawings be interpreted as illustrative and not limiting.

I claim as my invention:

1. A hermetically sealed functional electronic device comprising a substantially flat surfaced, relatively thin good thermally conductive support member comprising a metal selected from the group consisting of tantalum, tungsten and molybdenum and base alloys thereof, means for connecting the member to a heat sink, a relatively flat functional molecular electronic element joined at one flat surface to the support member and electrically insulated therefrom, the thermal expansion characteristics of the support member and the molecular electronic element being closely similar, at least two electrical leads joined to the element each extending substantially parallel to said one flat surface, a portion of each lead extending beyond the outer periphery of the support member and a relatively thin layer of electrically insulating material applied to and in contact with the other flat surface of the element and extending beyond all of the edges of the element, said layer of electrically insulating material being exclusively joined to the support member to hermetically enclose the element.

2. A functional molecular electronic device comprising a substantially flat surfaced, relatively thin good thermally conductive support member, one surface of the member having a cavity therein, means, for connecting the member to a heat sink, a relatively flat functional molecular electronic element disposed in the cavity and joined at one flat surface to the support member and electrically insulated therefrom, the thermal expansion characteristics of the support member and the molecular electronic element being closely similar, at least two electrical leads joined to the element each extending substantially parallel to said one flat surface, a portion of each lead extending beyond the outer periphery of the support member and a relatively thin layer of electrically insulating material applied to the other flat surface of the element and extending beyond the edges of the element, said layer of electrically insulating material being exclusively joined to the support member to hermetically enclose the element.

3. A functional molecular electronic device comprising a relatively thin, substantially flat surfaced good thermally conductive support member, one surface of the member having a thin walled, continuous stepped apertured ridge extending therefrom, the ridge delineating a cavity in its inner periphery, a relatively flat functional molecular electronic element joined at one surface to the support member within the cavity, the thermal expansion characteristics of the support member and the molecular electronic element being closely similar, at least two electrical leads joined to the element each extending substantially parallel to said one surface, a portion of each lead passing through an aperture in the ridge and extending beyond the outer periphery of the support member and a relatively thin insulating cover plate, said cover plate being exclusively joined to the stepped portion of the ridge and hermetically enclosing the element.

4. A hermetically enclosed electronic device comprising: a thermally conductive support member having opposed surfaces that are substantially flat; an electronic device having opposed surfaces that are substantially flat and a plurality of electrical leads each extending therefrom substantially parallel to said surfaces; a flat surface of said support member and a flat surface of said electronic device being joined; means to electrically insulate said joined flat surfaces of said support member and said electronic device; and a layer of electrical insulating material disposed over and in contact with the other flat surface of said electronic device; said layer of electrical insulating material being exclusively joined with said support member to hermetically enclose said electronic device.

5. A hermetically enclosed electronic device in accordance with claim 4 wherein: said support member is a metal having thermal expansion characteristics closely similar to those of said electronic device.

6. A hermetically enclosed electronic device in accordance with claim 4 wherein: said means to electrically insulate said joined flat surfaces of said support member and said electronic device is a non-conducting adhesive material.

7. A hermetically enclosed electronic device in accordance with claim 6 wherein said non-conducting adhesive material is an epoxy resin.

8. A hermetically enclosed electronic device in accordance with claim 4 wherein said layer of electrical insulating material disposed over the other flat surface of said electronic device is of resinous composition.

References Cited by the Examiner

UNITED STATES PATENTS

| | | | |
|---|---|---|---|
| 2,838,722 | 6/58 | Watson | 317—234 X |
| 2,887,628 | 5/59 | Zierdt | 317—234 |
| 2,921,244 | 1/60 | Emlis | 317—234 |
| 2,930,904 | 3/60 | Fritts. | |
| 2,946,935 | 7/60 | Finn | 317—234 |
| 3,002,133 | 9/61 | Maiden et al. | 317—234 |
| 3,110,836 | 11/63 | Blazek et al. | 174—52 X |

JOHN F. BURNS, *Primary Examiner.*

JOHN P. WILDMAN, *Examiner.*